(12) United States Patent
Davis et al.

(10) Patent No.: US 6,168,450 B1
(45) Date of Patent: Jan. 2, 2001

(54) SLOT 1 RETENTION DEVICE FOR PROCESSOR MODULE

(75) Inventors: Wayne Samuel Davis, Harrisburg; Robert Neil Whiteman, Jr., Middletown, both of PA (US)

(73) Assignee: The Whitaker Corporation, Wilmington, DE (US)

( * ) Notice: Under 35 U.S.C. 154(b), the term of this patent shall be extended for 0 days.

(21) Appl. No.: 09/226,375

(22) Filed: Jan. 6, 1999

Related U.S. Application Data

(60) Provisional application No. 60/073,017, filed on Jan. 29, 1998.

(51) Int. Cl.[7] .................................................. H01K 13/62
(52) U.S. Cl. ............................................. 439/327; 439/325
(58) Field of Search ....................... 439/327, 377, 439/64, 152, 159, 271, 382, 383, 384, 385, 328, 67, 68, 77, 325; 361/802

(56) References Cited

U.S. PATENT DOCUMENTS

| | | | |
|---|---|---|---|
| 3,829,741 | 8/1974 | Athey | 101/101 DH |
| 3,932,016 | 1/1976 | Ammenheuser | 339/65 |
| 4,070,081 | 1/1978 | Takahashi | 339/91 |
| 4,080,031 | 3/1978 | Sawford-Atkins | 339/65 |
| 4,178,051 | 12/1979 | Kocher et al. | 339/45 |
| 4,241,966 | 12/1980 | Gomez | 339/45 |
| 4,349,237 | 9/1982 | Cobaugh et al. | 339/65 |
| 4,648,009 | 3/1987 | Beun et al. | 361/399 |
| 4,712,848 | 12/1987 | Edgley | 439/327 |
| 4,761,141 | 8/1988 | Hawk et al. | 439/153 |
| 4,872,853 | 10/1989 | Webster | 439/327 |
| 5,030,108 | 7/1991 | Babow et al. | 439/64 |
| 5,162,979 | 11/1992 | Anzelone et al. | 361/415 |
| 5,216,578 | 6/1993 | Zenitani et al. | 361/383 |
| 5,267,872 | 12/1993 | Gou et al. | 439/326 |
| 5,417,580 | 5/1995 | Tsai | 439/328 |
| 5,542,854 | 8/1996 | Bowen | 439/377 |
| 5,573,408 | * 11/1996 | Laub et al. | 439/62 |
| 5,649,831 | 7/1997 | Townsend | 439/157 |
| 5,726,865 | 3/1998 | Webb et al. | 361/801 |
| 5,730,611 | 3/1998 | Cheng et al. | 439/160 |
| 5,762,513 | 6/1998 | Stine | 439/358 |
| 5,842,880 | 12/1998 | Pei | 439/327 |
| 5,928,024 | 7/1999 | Ming-Huang | 439/377 |
| 5,980,295 | 11/1999 | Lai et al. | 439/327 |
| 5,980,299 | * 11/1999 | Davis | 439/377 |

FOREIGN PATENT DOCUMENTS 28 12 332 A1   10/1978   (DE) ............................... H05K 7/14

OTHER PUBLICATIONS

U.S. Ser. No. 09/063,127 filed Apr. 20, 1998 (Abstract and Drawings only).

* cited by examiner

*Primary Examiner*—Paula Bradley
*Assistant Examiner*—Ross Gushi

(57) ABSTRACT

Retention systems for use with processor modules (20) on circuit boards upon mating with connectors (12). Such systems utilize end blocks (44) at ends (36) of the connector, having retention members (54) for securing the processor module in its mated position with the connector, stabilizing the module and relieving stress from the connector. Resilient members (80) are compressed by a leading end (26) of the module at sides (32) thereof upon full insertion into the retention members (54), maintaining sufficient pressure on the latching system (34,60) to remove looseness from the assembly and stabilize the module against the effects of vibration and other movement.

17 Claims, 10 Drawing Sheets

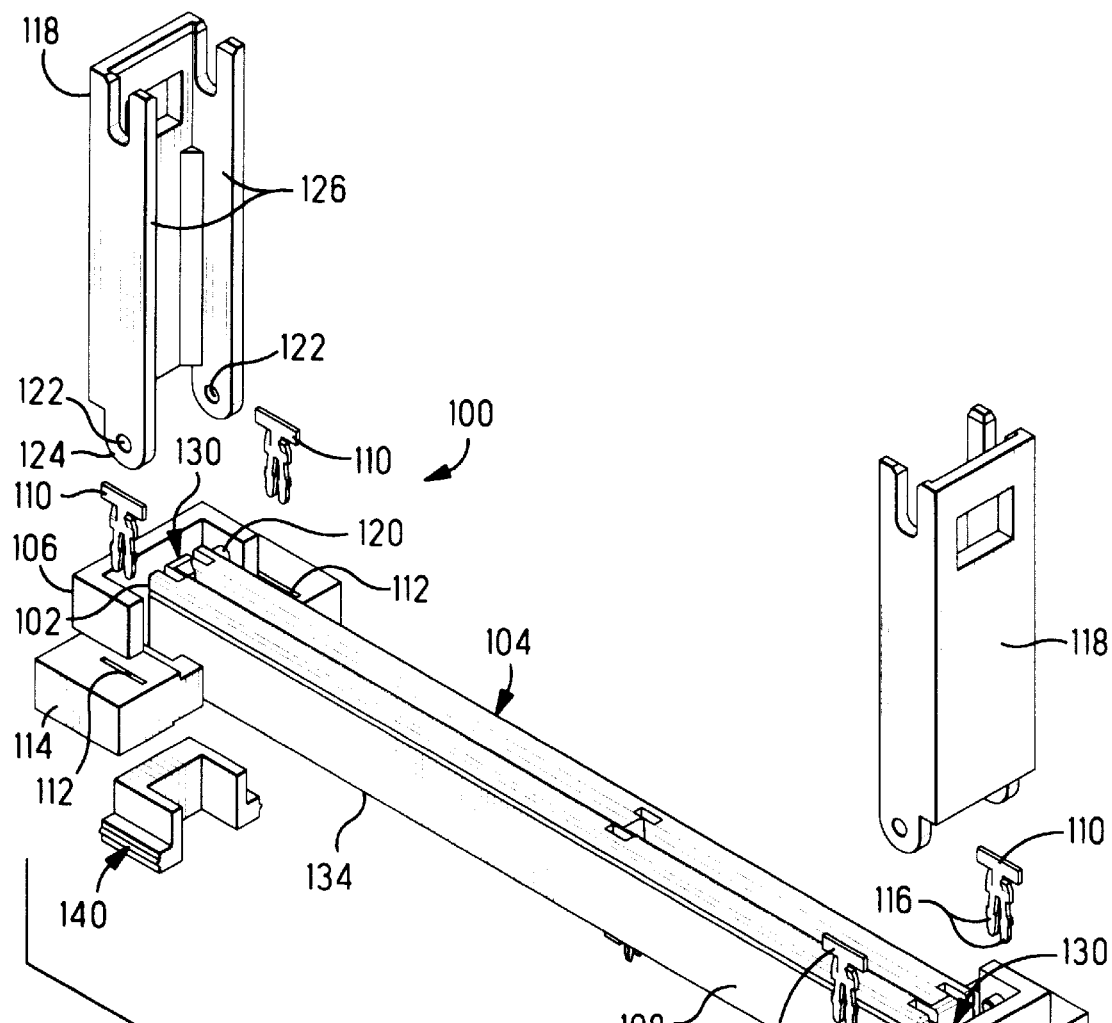
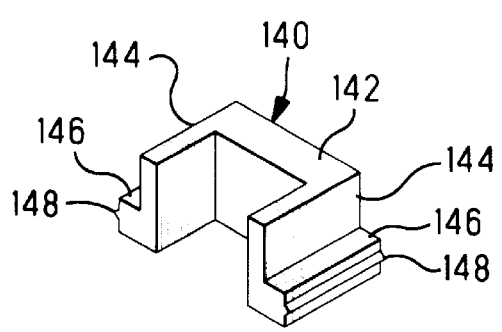

SLOT 1 RETENTION DEVICE FOR PROCESSOR MODULE

This application claims benefit to provisional application 60/073,017 filed Jan. 29, 1998.

FIELD OF THE INVENTION

This relates to the field of electrical connectors and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board; contact sections of the contacts are exposed within a card-receiving cavity of the connector that engage circuit pads on the card surfaces upon card insertion. It has become useful to secure certain cards within larger modules so that components mounted on the card are protected by the module covers during handling. Such modules, such as Slot 1 processor modules, need to be accurately guided during mating with the receptacle connector so that the leading end of the enclosed card is accurately received into the card-receiving cavity of the connector, since the module covers inhibit accurate visual alignment of the card with the cavity. It is known to provide elongate retention members projecting from the board from ends of receptacle connectors to facilitate mating in similar situations.

It is desired to assure that all tolerance is eliminated between the processor module and the retention members, to eliminate looseness from the resulting mated assembly and stabilize the module against the effects of vibration and other movement.

SUMMARY OF THE INVENTION

The present invention provides resilient members adjacent the inner ends of the retention members and at opposed ends of the receptacle connector that are positioned between the retention members, to be engaged and compressed by ends of the leading end of the processor module upon full mating with the connector, as the module is latched in the fully mated position by the retention members so that the compressed resilient members continue thereafter to exert pressure to maintain the fully latched engagement of the cooperating latch members.

In embodiments where the housing of the receptacle connector includes integral mounting blocks at ends thereof, where elongate retention members are either integral with or are affixed to the mounting blocks, resilient members are retained in openings of the mounting blocks to be compressed by opposed ends of the leading end of the module cover upon full mating with the connector and latching with the retention members.

In other embodiments where the mounting blocks that are separate members affixed at ends of the receptacle connector housing and the retention members are integral with the mounting blocks, recesses are provided in the mounting blocks into which are inserted resilient members that are disposed at the connector ends to be engaged by the module cover leading end; the mounting blocks may be mountable either to the circuit board or may be locked to the connector housing.

Embodiments of the present invention will now be described by way of example with reference to the accompanying drawings.

BRIEF DESCRIPTION OF THE DRAWINGS

FIG. 5 is an isometric view of a second embodiment of retention system where end blocks are integral with the connector, with discrete pivotable retention members, boardlocks and resilient members exploded therefrom;

FIG. 6 is an isometric view of a resilient member of FIG. 5;

DETAILED DESCRIPTION

Figure 1:
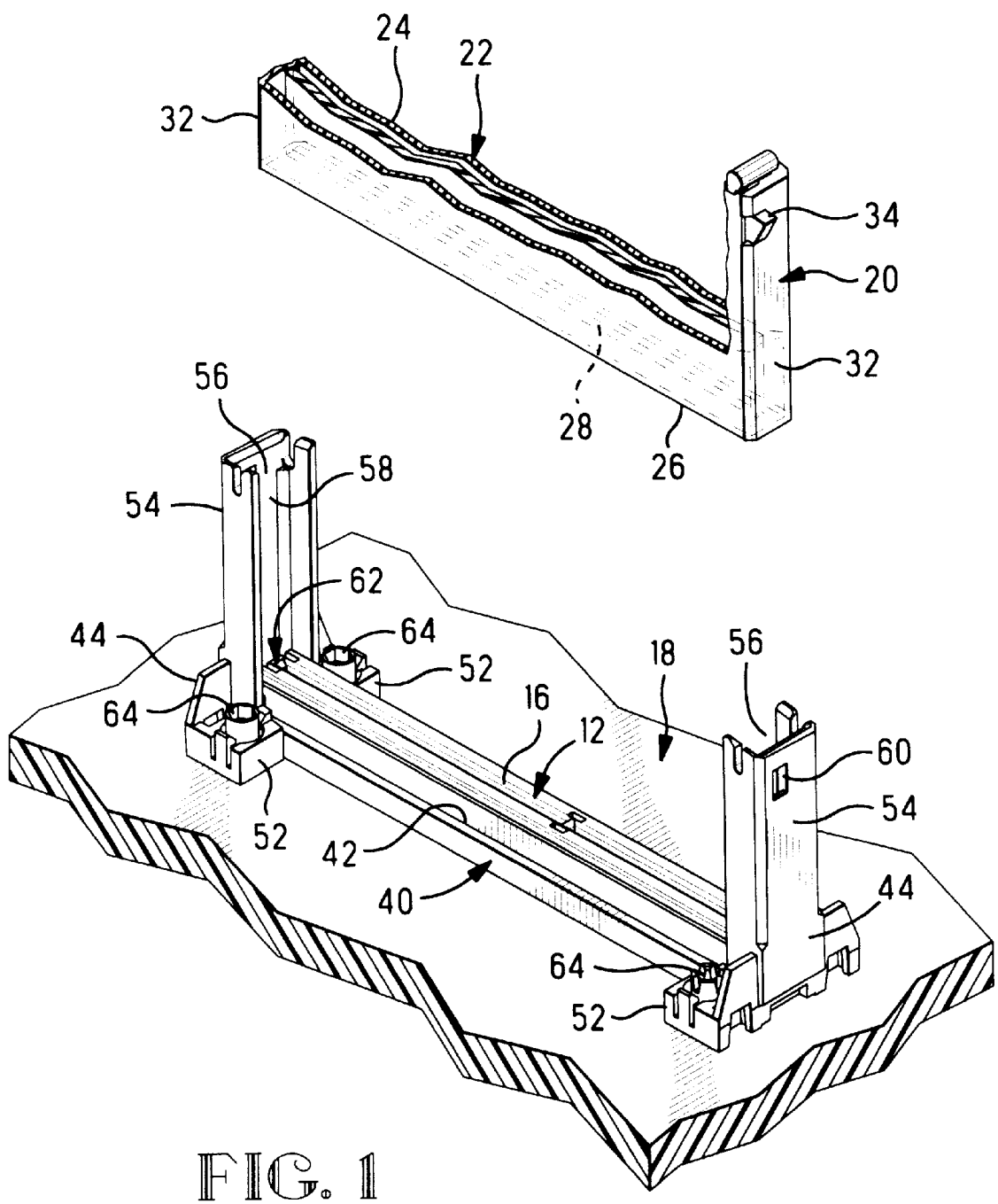
FIG. 1 is an isometric view of a connector mounted on a circuit board, with an integral retention module therearound mounted to the board, and a processor module positioned to be inserted into the retention module for mating with the connector.
Figure 2:
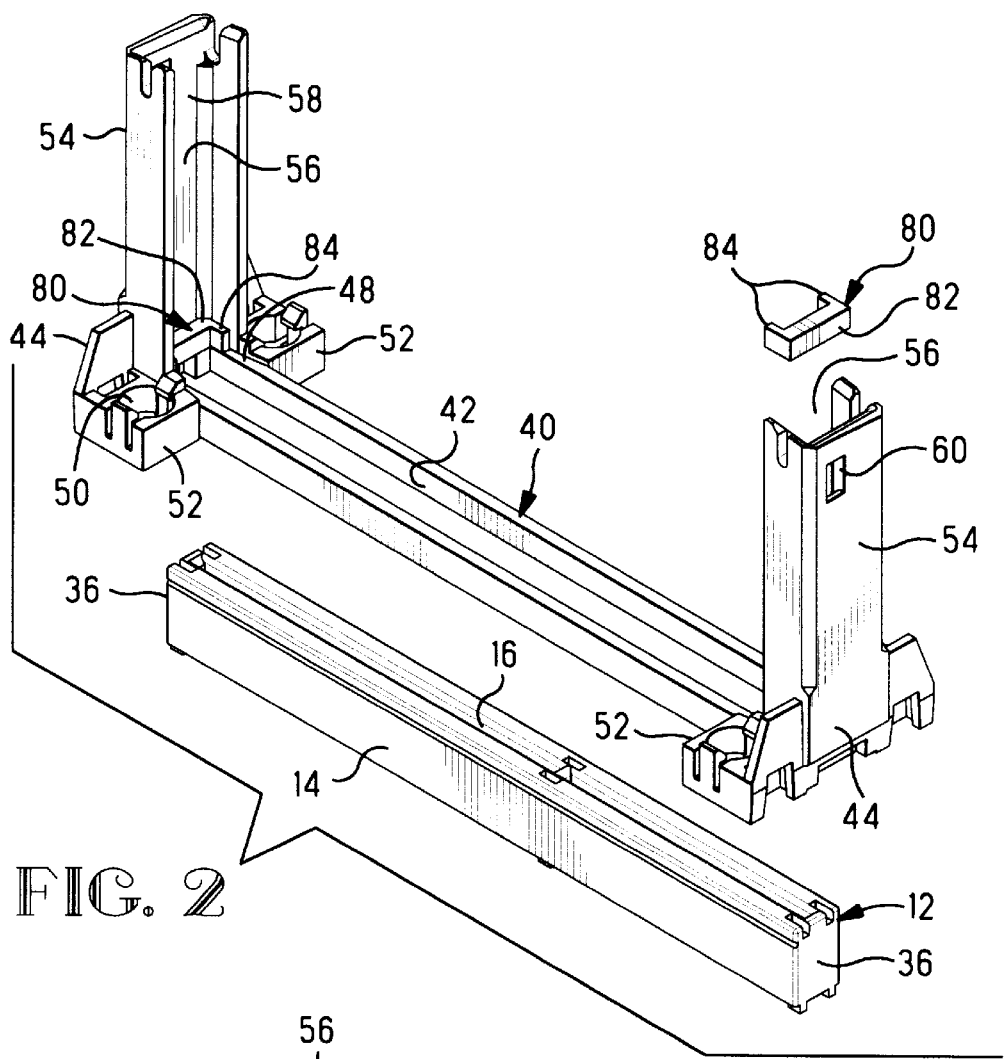
FIG. 2 is an isometric view of the retention module and the connector of FIG. 1, with one of the resilient members exploded therefrom with another placed in position.
Figure 3:
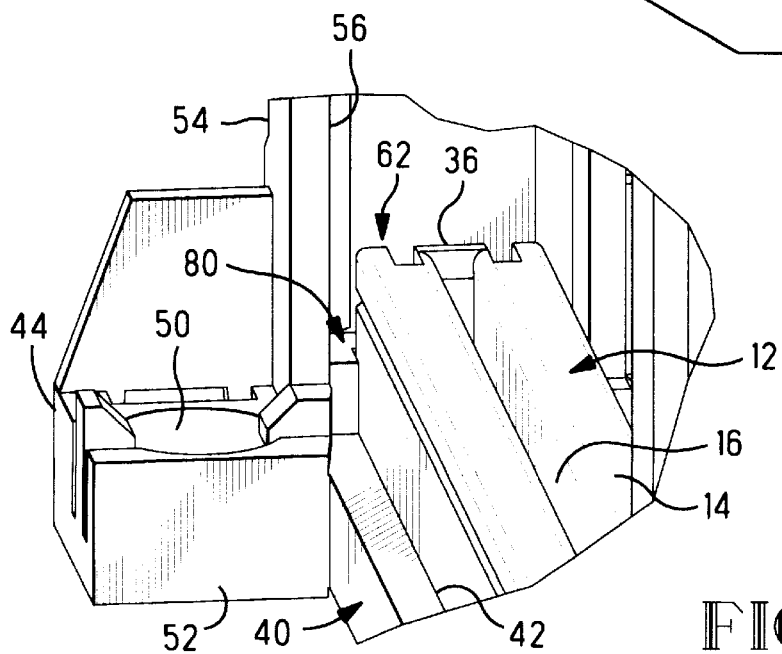
FIG. 3 is an enlarged isometric view of one end of the assembly of FIG. 1.

Assembly 10 of FIGS. 1 to 4 illustrates a first embodiment of retention system utilizing the resilient members of the present invention. A receptacle connector 12 is shown mounted on a circuit board 18 and having a housing 14 of insulative material having a card-receiving cavity or slot 16 along both sides of which are arrays of contacts (not shown). Connector 12 may be, for example, of the type sold by AMP Incorporated under Part Nos. 145251-1 and -2. A processor module 20 is shown positioned above Connector 12 to become mated therewith; module 20 includes a circuit card 22 affixed within a protective covering 24, and a leading end 26 of the module is open to expose the leading end 28 of the card to be inserted into card-receiving slot 16 of connector 12 upon mating. Contacts of connector 12 are engageable with circuit pads of the card adjacent the leading end thereof. The processor module may have a massive heat sink (not shown) mounted along one side thereof.

The retention system includes a one-piece frame 40 which defines a connector-receiving opening 42 therealong including end blocks 44 that are integral therewith at opposed ends 46 of opening 42. Fasteners 64 are held in holes 50 through flanges 52 to either side of each end block 44 used in cooperation with bolts (not shown) for securing frame 40 firmly to circuit board 18, as disclosed in greater particularity in U.S. patent application Ser. No. 09/063,127 filed Apr. 20, 1998 and assigned to the assignee hereof.

A retention member 54 is integral with each end block 44, extending upwardly from ends 46. Each retention member 54 is U-shaped to define a guide channel 56 along the inner surface thereof and precisely aligned with card-receiving slot 16 of connector 12. Guide channels 56 are dimensioned to receive therein side portions 32 of module 20 so that card leading end 28 becomes aligned for receipt into card-receiving cavity 16 during mating for the circuit pads thereof to become electrically engaged by the connector's contacts. Entrances to the guide channels may be chamfered to facilitate insertion of the module side portions 32 thereinto. Retention members 54 are positioned spaced apart so that channel bottom surfaces 58 oppose each other spaced apart a width of the module in order to position the module accurately lengthwise of the card-receiving slot. The retention members 54 include latch apertures 60 as shown within which corresponding latch projections 34 on side surfaces of the module may latch, for retention in the mated condition. Sufficient clearances 62 around ends 36 of connector 12 are provided by retention members 54 for receipt thereinto of leading end 26 of the module covering 24 around connector ends 36, when card leading end 28 is received into card-receiving slot 16.

Resilient members 80 of the present invention are seated in clearance openings 62 at inner ends of channels 56 outwardly of ends 36 of connector 12 and positioned atop upwardly facing surfaces 48, such as by being in interference fit between opposed walls of retention member 54, or optionally by being bonded in place. Resilient members 80 are shown to include a transverse body section 82 adjacent channel bottom 58, and side flanges 84 extending orthogonally therefrom that coextend partially along side surfaces of connector 12. Resilient members 80 are thus configured similarly to the ends 32 of cover 24 of module 20 and thus are abutted and compressed thereby against surfaces 48 when module 20 is fully moved along channels 56 to mate with connector 12, for leading end 28 of card 22 to be received into card-receiving slot 16, at which time latch projections 34 are latched in latch recesses 60 of retention members 54.

Figure 4:
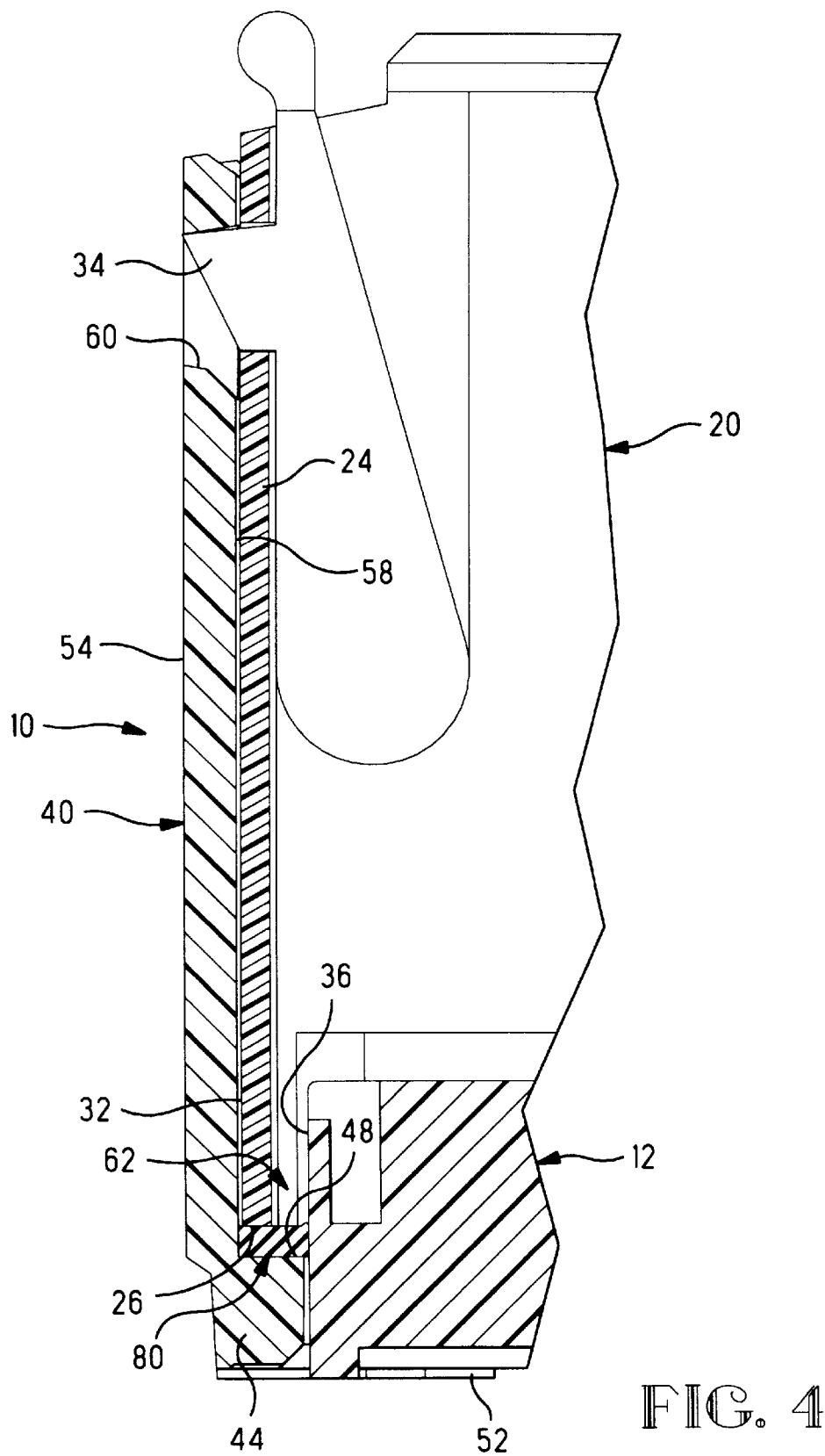
FIG. 4 is an enlarged longitudinal sectional view of one end of the assembly of FIG. 1 with a processor module mated with the connector.
Figure 7:
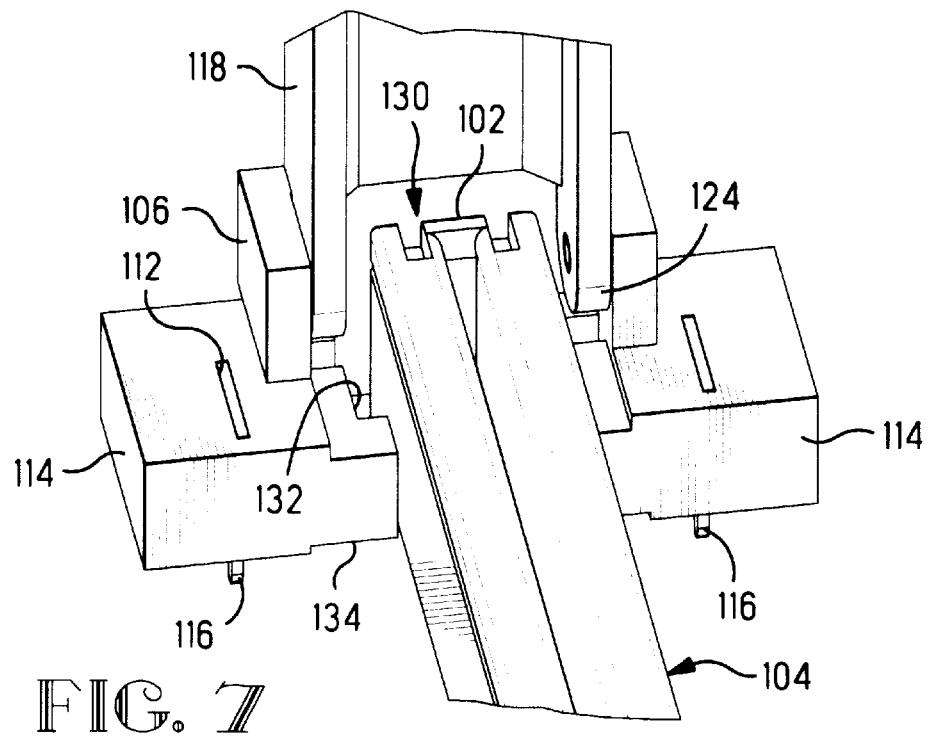
FIGS. 7 and 8 are enlarged isometric views of one end of the connector of FIG. 5 before and after assembling the resilient member of FIG. 6 into position.

As shown in FIG. 4, resilient members 80 upon compression by module 20, exert a force upwardly on the module to maintain the latch projections 34 firmly in latching engagement with latching surfaces of recesses 60. This results in no looseness or tolerances that would otherwise permit the module to move incrementally during movement of a computer or vibration thereof, and this in turn enhances the stability of the electrical connections as well as reduces wear and tear on the components within the module during in-service use. Additionally, resilient members 80 exert a force upwardly on a module to partially eject the module during delatching of the module latches, facilitating module removal when service personnel are manually actuating the latch members on opposed sides of the module, urging them toward each other. Resilient members 80 may be of elastomeric material such as foam rubber or rubber such as from Buna-N nitrile resin, ASTM-NBR.

Referring now to FIGS. 5 to 9, a second embodiment of retention system is shown. The retention system is comprised of a pair of end block assemblies 100 at ends 102 of connector 104. End block assemblies 100 include end blocks 106 integral with housing 108 of connector 104, and boardlocks 110 are inserted into slots 112 through flanges 114 so that retention legs 116 of the boardlocks are received into mounting holes (not shown) of the board, for mounting the connector to the circuit board in accordance with a conventional connector-mounting technique, wherein access to the bottom of the circuit board is unnecessary. An additional board lock is also seen approximately in the middle of elongate connector 104.

End block assemblies 100 also include retention members 118 that are pivotably mounted to end blocks 106; the retention members are pivotable between upright positions orthogonal to the board and the receptacle connector 12 to receive a processor module therealong, and recumbent positions (see FIG. 9); pivot pins 120 are seated in holes 122 through bottom tabs 124 of side walls 126 of retention members 118, with tabs 124 temporarily deflected toward each other until pins 120 become seated in holes 122. The recumbent positions are useful during shipping and handling at which time no module would be utilized, minimizing a potential to be damaged and also minimizing the overall height of the retention system to facilitate handling and storage, all as is discussed in U.S. Ser. No. 09/063,127 filed Apr. 20, 1998.

Figure 8:
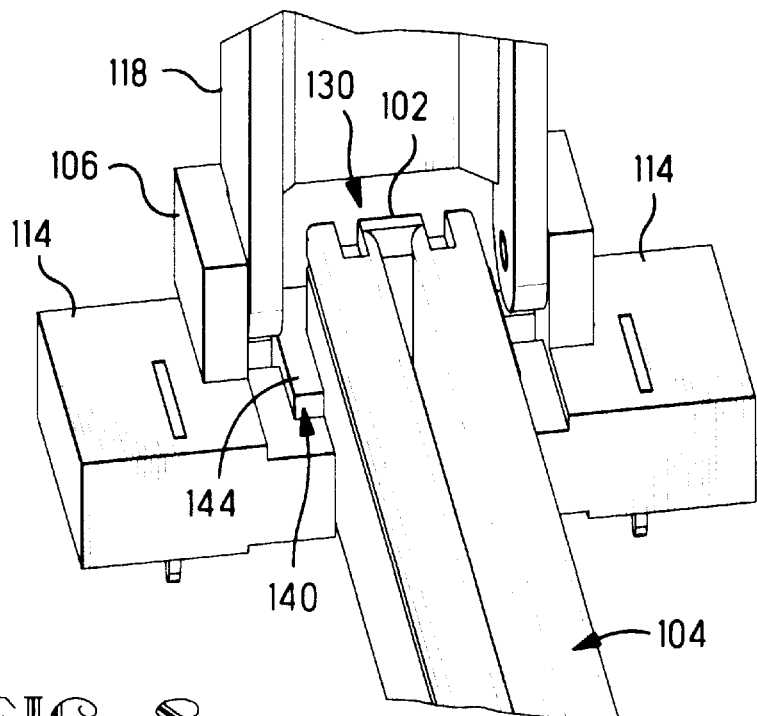
Figure 9:
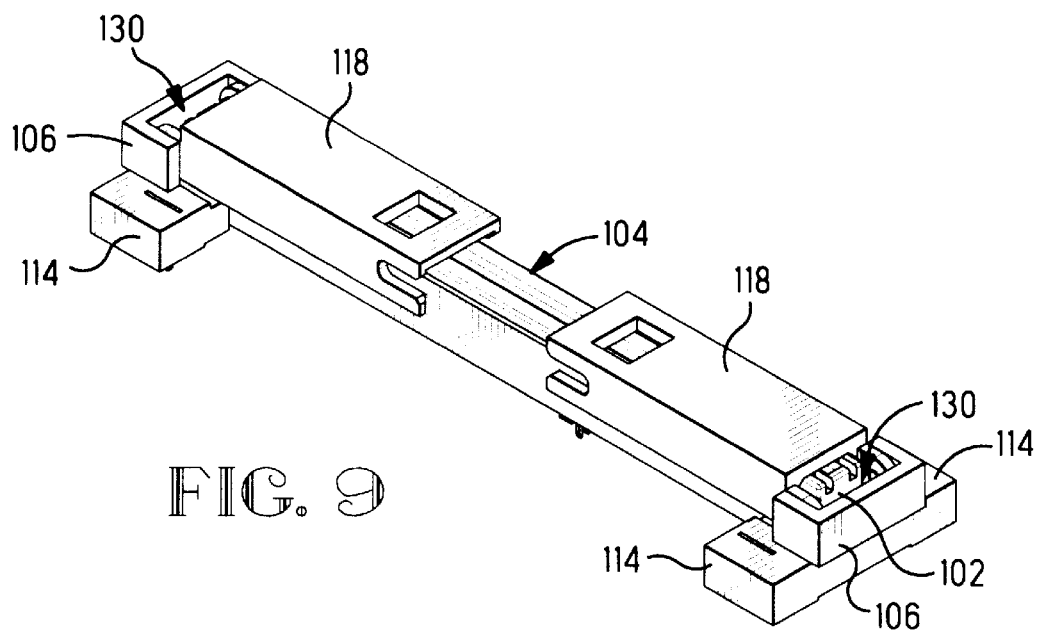
FIG. 9 is an isometric view of the assembly of FIG. 5 with the retention members pivoted into a recumbent orientation prior to mating with a processor module.

Clearances 130 are defined adjacent to connector ends 102, with openings 132 (FIG. 7) in communication with board-mounting face 134 of the connector housing. Resilient members 140 are insertable into openings 132 from board-mounting face 134 and self-secure therein. Each resilient member 140 includes a transverse body 142 and opposed side walls 144 extending orthogonally therefrom. Along an outer surface of each side wall 144 is seen a flange 146 extending outwardly, and a retention rib 148 projecting further outwardly therefrom. Retention ribs 148 will define an interference fit with end block 106 when the resilient member 140 is inserted into opening 132 from board-mounting face 134, with flanges 146 abutting ledges adjacent to the sides of opening 132 when the resilient member is fully inserted, upon which upper portions of transverse body 142 and side walls 144 will project upwardly into clearance 130, as seen in FIG. 8. Resilient members 140 will be compressed directly against the circuit board upon full module insertion.

In FIGS. 10 to 13 is shown a third embodiment of retention system, wherein retention assemblies 200 are separate from connector 202, with the connector and the retention assemblies to be separately mounted to a circuit board. End block members 204 each are board mounted by boardlocks 206. Retention members 208 are pivotably mountable to end block members 204, similarly to retention members 118 of FIGS. 5 to 9.

Figure 11:
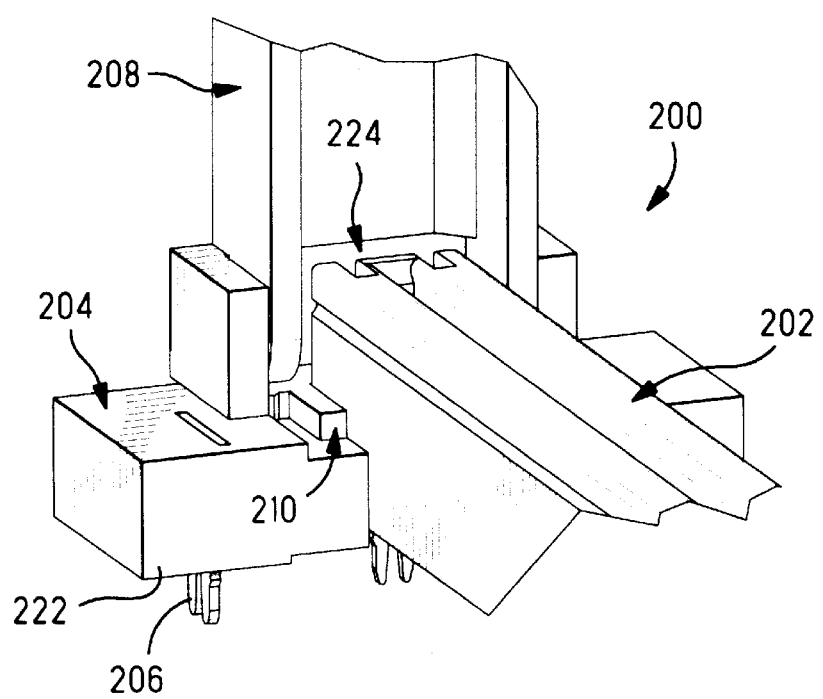
FIG. 11 is an enlarged part view of one end of the retention system of FIG. 10 after assembly.
Figure 10:
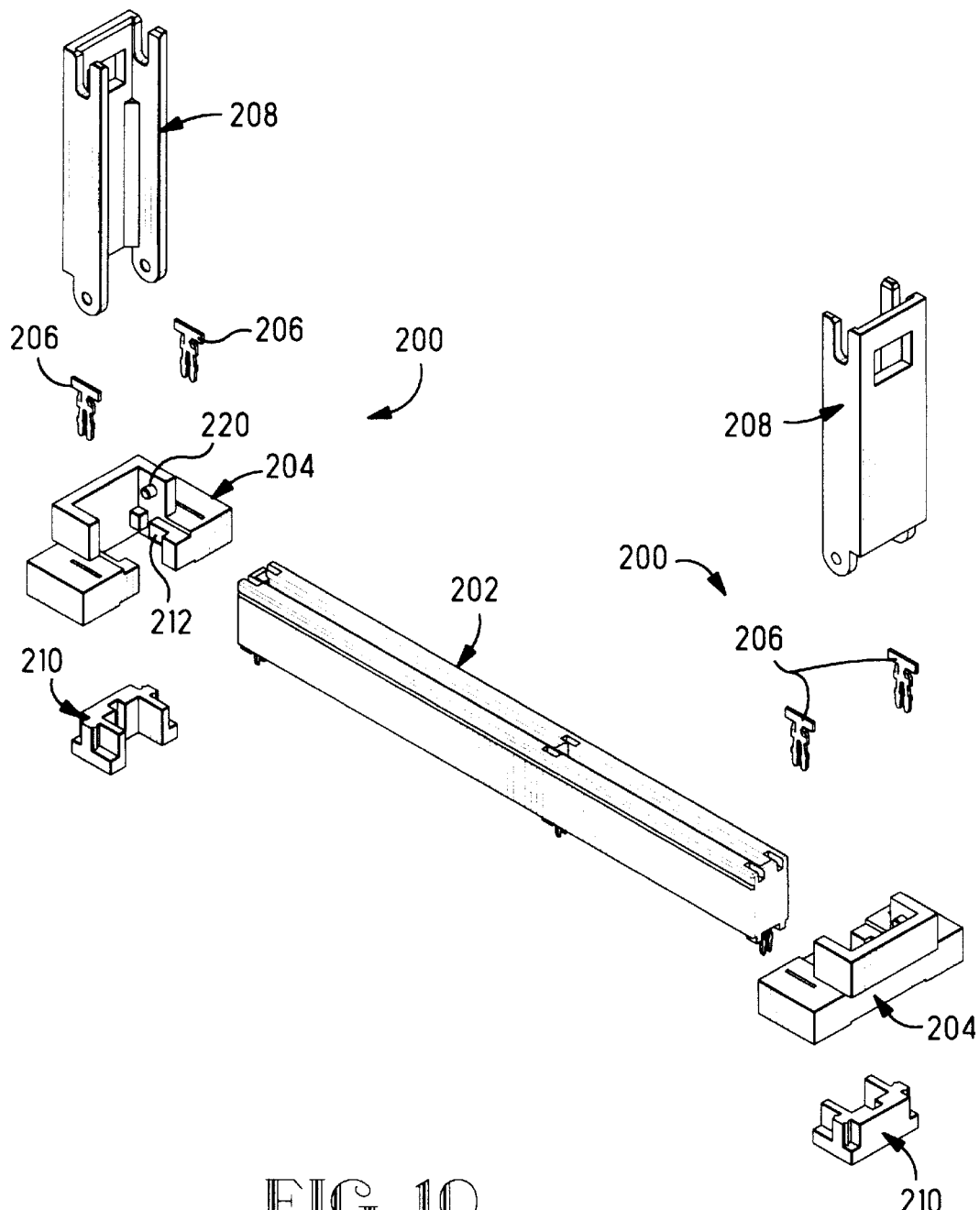
FIG. 10 is an exploded isometric view of a third embodiment of retention system having separate board-mountable end blocks exploded from ends of a connector, with retention members, boardlocks and resilient members exploded therefrom.
Figure 12:
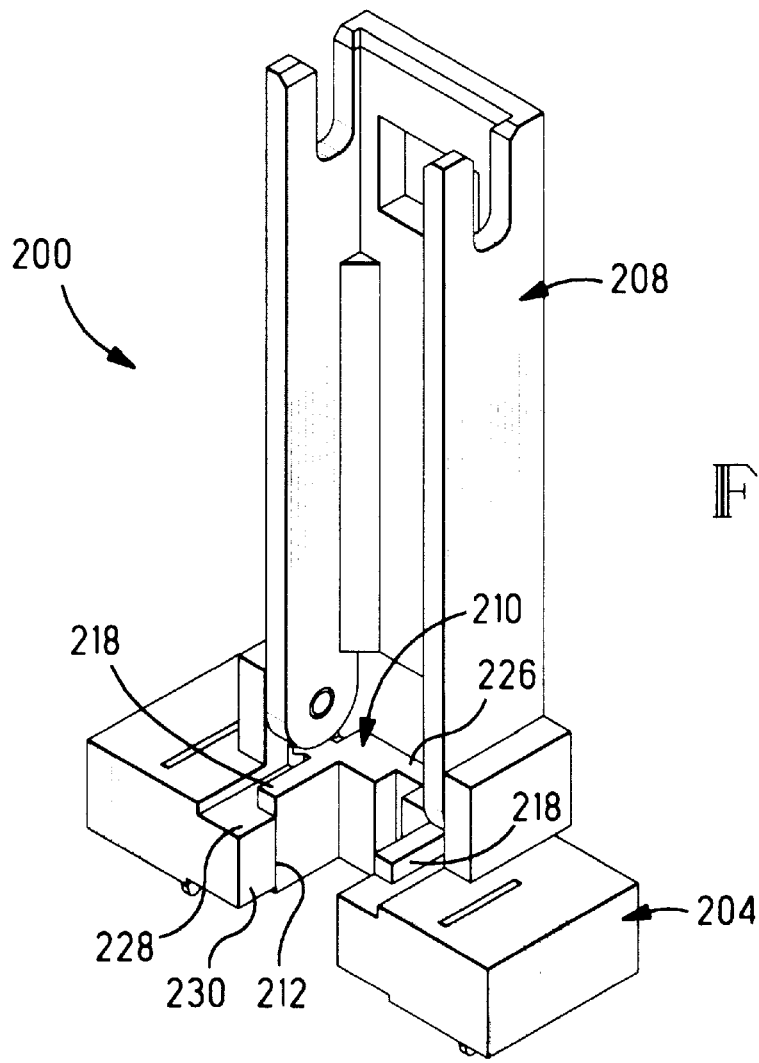
FIG. 12 is an enlarged view of one of the retention assemblies of FIG. 10.
Figure 13:
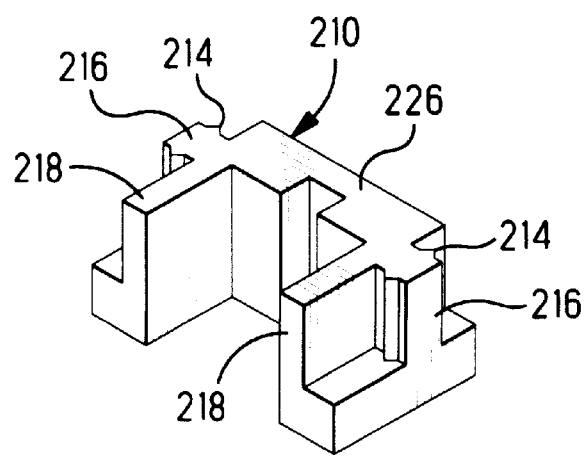
FIG. 13 is an enlarged isometric view of a resilient member of FIGS. 10 to 12.
Figure 14:
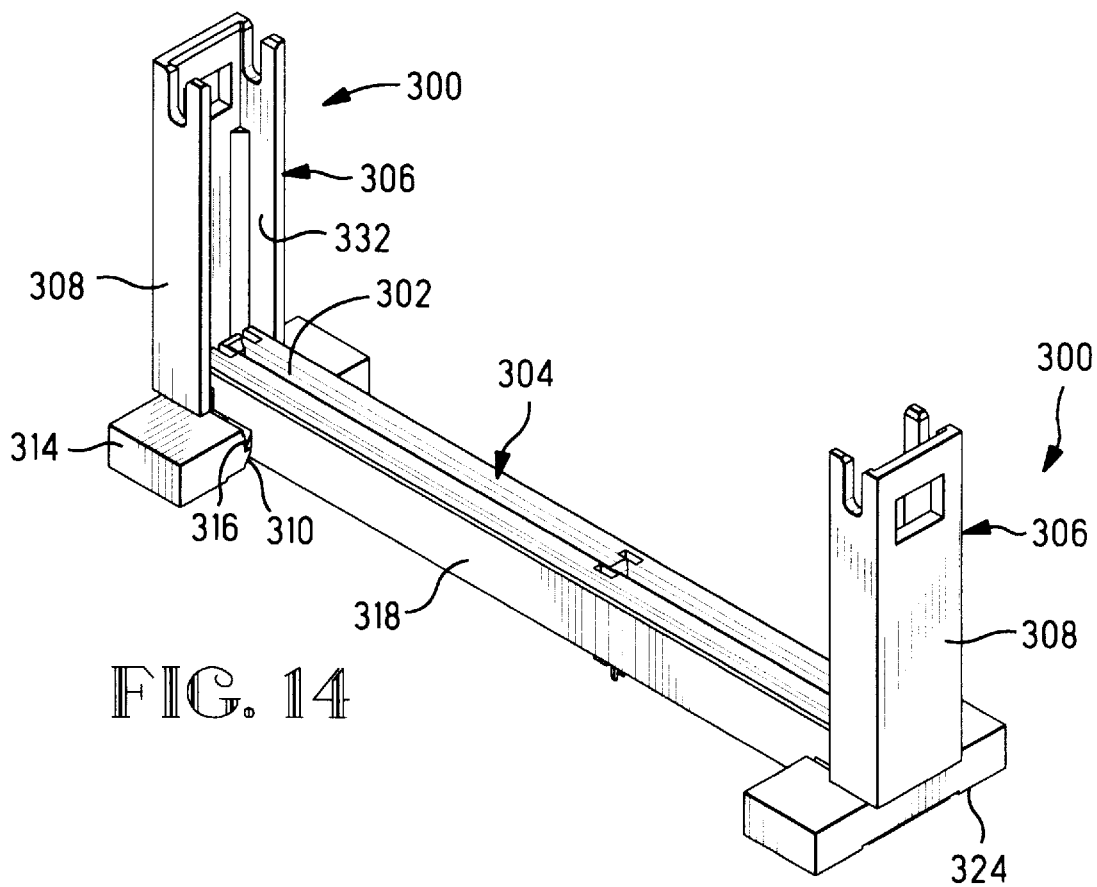
FIG. 14 is an isometric view of a fourth embodiment of retention system, with separate end blocks affixed to the ends of a connector.
Figure 15:
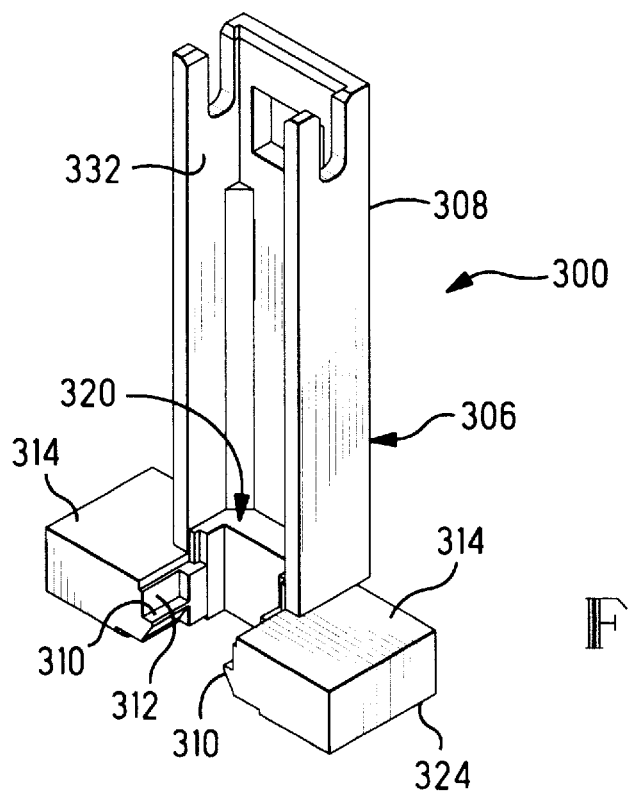
FIG. 15 is an isometric view of one of the end block assemblies of FIG. 14.

Resilient members 210 are again insertable into openings 212 of end blocks 204, and vertical retention ribs 214 are defined along vertical flanges 216 projecting outwardly from side walls 218 of the resilient members to define an interference fit within vertical channels 220. Channels 220 extend upwardly from board-mounting face 222 of end block members 204 to communicate with openings 212 and clearances 224, with upper portions of transverse body 226 and side walls 218 rising above upwardly facing surfaces 228 of the end block adjacent the connector-receiving recess 230 and projecting into clearances 224, as is seen in FIGS. 11 and 12. In FIG. 12, the connector is not illustrated, in order to reveal the resilient member in position within the end block. As with resilient members 140 of FIGS. 4 to 9, resilient members 210 will be compressed directly against the circuit board upon full module insertion.

A fourth embodiment of retention system is shown in FIGS. 14 to 17. Retention assemblies 300 are securable to ends 302 of the connector 304 instead of to the circuit board. Retention assemblies 300 each include an end block member 306 having a retention member 308 integral therewith. Each end block member 306 is adapted to be affixable to the connector after the connector has been mounted onto the circuit board, by a pair of latch projections 310 along inwardly facing surfaces of the connector-receiving recess 312 defined between flanges 314, to latch beneath complementary latch projections 316 along outwardly facing surfaces of housing 318 of connector 304 proximate a respective end 302 when end block member 306 is urged downwardly at end 302.

Figures 16, 17:
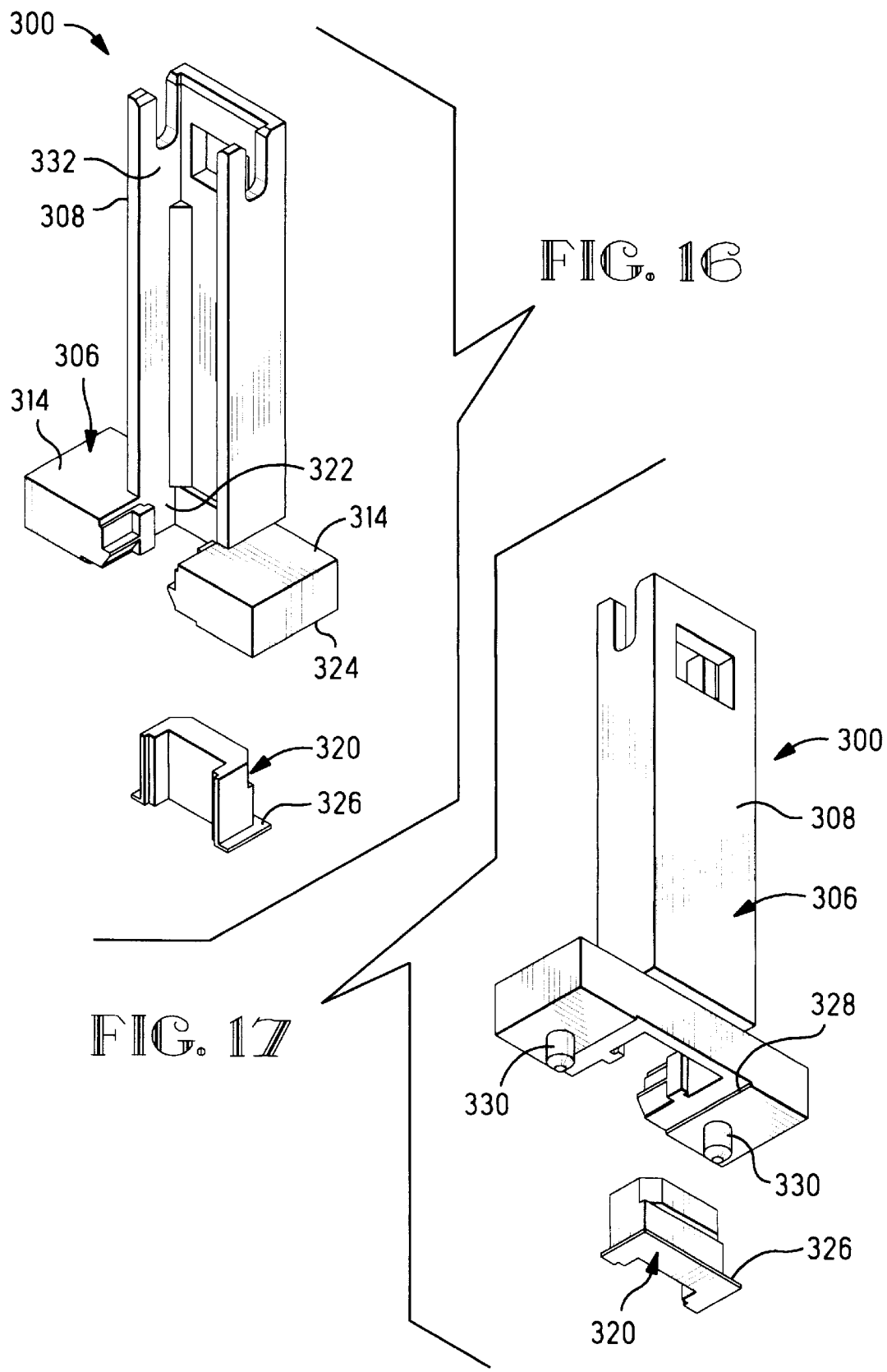
FIGS. 16 and 17 are top and bottom isometric views of the end block of FIG. 15 with a resilient member exploded therefrom.

Resilient member 320 is insertable into opening 322 in end block member 306 from board-proximate face 324, and is preferably dimensioned to be slightly larger cross-sectionally than the opening to define an interference fit therein for retention prior to being affixed to the previously board-mounted connector. An outwardly extending flange 326 extends into a corresponding shallow recess 328 along board-proximate face 324 to assure that the resilient member will not be overinserted into opening 322; preferably the thickness of flange 326 is sufficient to protrude slightly below board-proximate face 324 and will engage the circuit board after retention assembly 300 is affixed to the connector when compressed by a processor module upon module mating with connector 304. Also seen in FIG. 17 are a pair of locating bosses 330 depending from board-proximate face 324 to be received into corresponding holes of the circuit board and stabilizing the retention member against lateral movement along the circuit board, such as when a processor module is inserted along guide channels 332 of retention members 308 and isolating connector 304 from stresses resulting therefrom.

The present invention provides an efficient manner of removing looseness of a module in the retention assembly, and additionally facilitates removal of a module from its mated condition with the receptacle connector by partially ejecting the module upon delatching.

Modifications and variations may occur from the specific examples provided herein, that are within the spirit of the invention and the scope of the claims. The resilient member may be used with a connector having integral module retention systems, or with add-on retention systems. The present invention may for example be utilized with board-mounting arrangements other than that used for processor modules.

What is claimed is:

1. A retention system for securing a processor module to a circuit board-mounted connector, comprising:

retention members disposed at opposed ends of the connector, said retention members defining therebetween a module-receiving channel extending to said connector and adapted to receive the module therebetween during mating of the module with the connector, and resilient members adjacent inner ends of said retention members at opposed ends of said connector extending partially into said module-receiving channel to become abutted and compressed by opposed ends of a leading end of said module upon full insertion of said module into said channel and mating thereof with said connector.

2. The retention system as set forth in claim 1 wherein said resilient members abut the circuit board.

3. The retention system as set forth in claim 1 wherein said retention members include latches for latching said module in said channel in its fully inserted and mated position.

4. The retention system as set forth in claim 1 wherein said resilient members extend partially along sides of said connector.

5. The retention system as set forth in claim 1 wherein said resilient members are disposed in openings of mounting blocks for mounting said retention members to said circuit board.

6. The retention system as set forth in claim 5 wherein said resilient members are secured in said openings by adhesive.

7. The retention system as set forth in claim 5 wherein said resilient members are secured in said openings by interference fit.

8. The retention system as set forth in claim 5 wherein said mounting blocks are integral with said retention members.

9. The retention system as set forth in claim 5 wherein said resilient members are affixed in said openings atop upwardly facing surfaces of said mounting blocks.

10. The retention system as set forth in claim 5 wherein said each said mounting block is integral with a respective said retention member, and said integral retention/mounting block member is affixable to said connector, said integral member includes a board-proximate face, and said resilient member extends partially below said board-mounting face to assuredly engage said circuit board upon said integral member being affixed to said connector.

11. The retention system as set forth in claim 5 wherein said mounting blocks are initially separate from said retention members to which said retention members are affixed.

12. The retention system as set forth in claim 11 wherein said mounting blocks are integral with said connector.

13. The retention system as set forth in claim 11 wherein said mounting blocks are separate members affixable to said retention members.

14. The retention system as set forth in claim 11 wherein said openings are in communication with a board-mounting face of said mounting blocks and include wide opening portions adjacent said board-mounting face, and said resilient members include flanges extending outwardly into said wide opening portions and include horizontal ribs for defining an interference fit with side walls of said wide opening portions.

15. The retention system as set forth in claim 11 wherein said openings are in communication with a board-mounting face of said mounting blocks and include wide opening portions in communication with both said board-mounting face and said channels, and said resilient members include flanges extending outwardly into said wide opening portions and include vertical ribs for defining an interference fit with side walls of said wide opening portions.

16. A retention system for securing a processor module to a circuit board-mounted connector, comprising:

retention members disposed at opposed ends of the connector, said retention members defining therebetween a module-receiving channel extending to said connector and adapted to receive therebetween the module during mating of the module with the connector, and each said retention member having an end block portion which has a connector-receiving recess, and further having latch projections along surfaces of the connector-receiving recess to latch with complementary latch projections along surfaces of said connector at respective ends of said connector.

17. The retention system as set forth in claim 16 wherein each said latch projection defines an upwardly facing latching surface and a camming surface angled inwardly and downwardly, for said latch projection to bear against and pass by said complementary latching projection and latch beneath a downwardly facing latching surface thereof.

\* \* \* \* \*